(12) United States Patent
Lu et al.

(10) Patent No.: US 10,381,056 B2
(45) Date of Patent: Aug. 13, 2019

(54) DUAL PORT STATIC RANDOM ACCESS MEMORY (DPSRAM) CELL

(71) Applicant: UNITED MICROELECTRONICS CORP., Hsin-Chu (TW)

(72) Inventors: Tien-Yu Lu, Taichung (TW); Chun-Hsien Huang, Tainan (TW); Ching-Cheng Lung, Tainan (TW); Yu-Tse Kuo, Tainan (TW); Shou-Sian Chen, Tainan (TW); Koji Nii, Tokyo (JP); Yuichiro Ishii, Tokyo (JP)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/992,130

(22) Filed: May 29, 2018

(65) Prior Publication Data

US 2019/0206459 A1    Jul. 4, 2019

(30) Foreign Application Priority Data

Jan. 4, 2018    (CN) .......................... 2018 1 0007557

(51) Int. Cl.
*G11C 8/16*      (2006.01)
*G11C 8/08*      (2006.01)
*H01L 27/11*     (2006.01)
*G11C 11/412*    (2006.01)
*G11C 7/12*      (2006.01)

(52) U.S. Cl.
CPC .................. *G11C 8/16* (2013.01); *G11C 7/12* (2013.01); *G11C 8/08* (2013.01); *G11C 11/412* (2013.01); *H01L 27/11* (2013.01)

(58) Field of Classification Search
CPC ..... G11C 8/16; G11C 7/12; G11C 8/08; G11C 11/412; H01L 27/11
USPC ..................................................... 365/230.05
See application file for complete search history.

(56) References Cited

U.S. PATENT DOCUMENTS

| 8,315,084 | B2* | 11/2012 | Liaw .................. G11C 11/413 365/154 |
| 2019/0088585 | A1* | 3/2019 | Liaw .................. G11C 11/412 |

OTHER PUBLICATIONS

Yeh, Title of Invention: Layout Pattern for Static Random Access Memory, U.S. Appl. No. 15/186,548, filed Jun. 20, 2016.

* cited by examiner

*Primary Examiner* — Fernando Hidalgo
(74) *Attorney, Agent, or Firm* — Winston Hsu

(57) ABSTRACT

A dual port static random access memory (DPSRAM) cell includes a first power line, a first bit line and a second bit line. The first power line is disposed between a first word line and a second word line. The first bit line is disposed between the first word line and the first power line. The second bit line is disposed between the second word line and the first power line.

28 Claims, 8 Drawing Sheets

FIG. 8

DUAL PORT STATIC RANDOM ACCESS MEMORY (DPSRAM) CELL

BACKGROUND OF THE INVENTION

1. Field of the Invention

The present invention relates generally to a static random access memory cell (SRAM), and more specifically to a dual port static random access memory cell (DPSRAM).

2. Description of the Prior Art

A static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data while the remaining power is applied, unlike dynamic random access memory (DRAM) that needs to be periodically refreshed. Because of its high access speed, SRAM is also used in computer systems as a cache memory.

SUMMARY OF THE INVENTION

The present invention provides a dual port static random access memory cell, which has symmetric metal interconnect layouts, thereby enhancing reading speed in a same layout area and improving bit line coupling.

The present invention provides a dual port static random access memory cell including a first power line, a first bit line and a second bit line. The first power line is disposed between a first word line and a second word line. The first bit line is disposed between the first word line and the first power line. The second bit line is disposed between the second word line and the first power line.

According to the above, the present invention provides a dual port static random access memory cell, which includes a first power line located between a first word line and a second word line, a first bit line located between the first power line and the first word line, and a second bit line located between the first power line and the second word line. Therefore, the dual port static random access memory cell of the present invention has a symmetric metal interconnect layout, and thus has a symmetric read current (Iread) distribution. This enhances reading speed in a same layout area, reduces resistance and improves bit line coupling.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 8 depicts a metal line layout diagram of a dual port static random access memory cell according to a preferred embodiment of the present invention.

DETAILED DESCRIPTION

Figure 1:
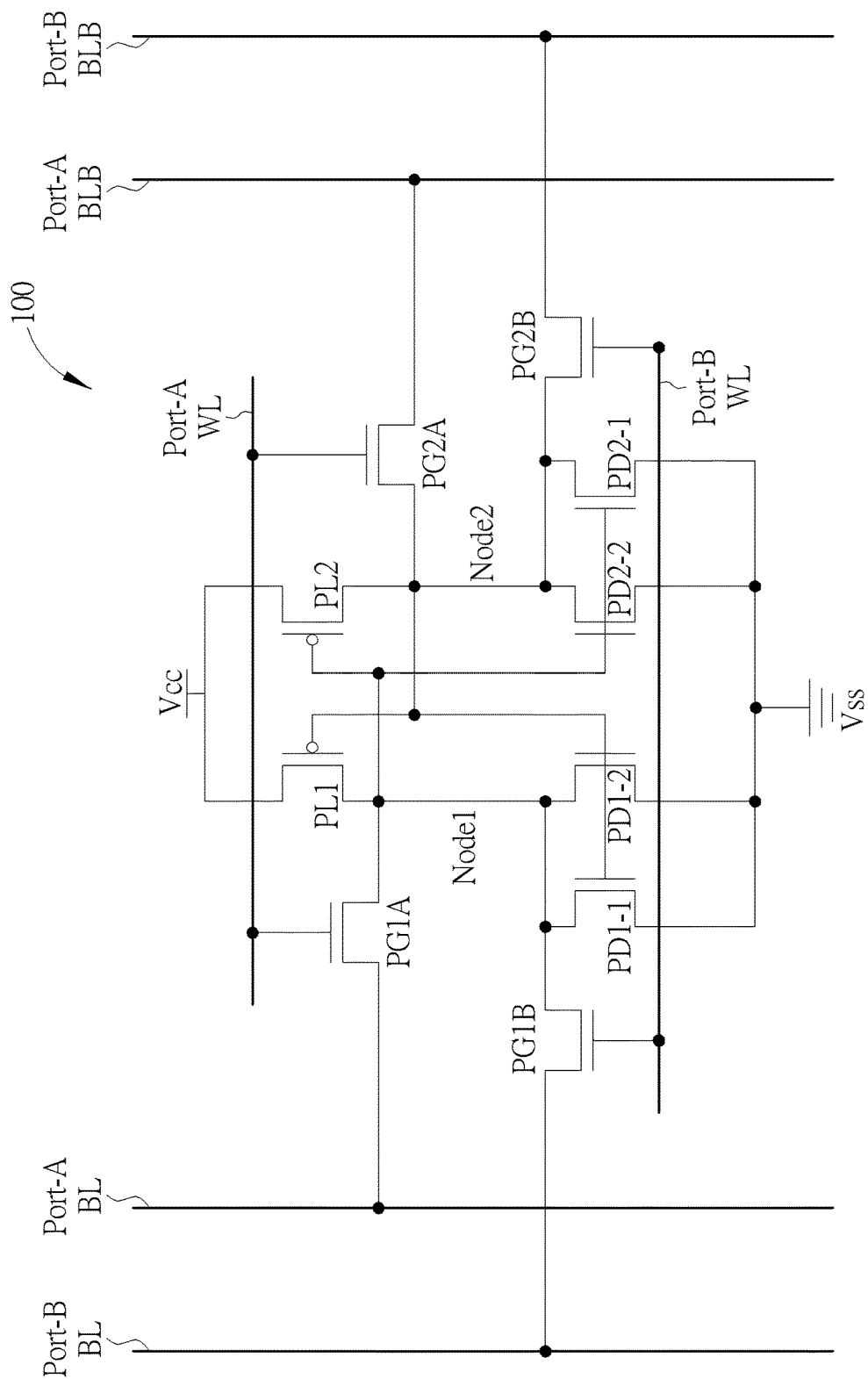
FIG. 1 depicts a circuit diagram of a dual port static random access memory cell including a ten-transistor SRAM (10T-SRAM) cell according to an embodiment of the present invention.

FIG. 1 depicts a circuit diagram of a dual port static random access memory cell including a ten-transistor SRAM (10T-SRAM) cell according to an embodiment of the present invention. As shown in FIG. 1, a dual port static random access memory cell 100 includes a first inverter and a second inverter that are cross-coupled. The first inverter includes a first pull-up device PL1 such as a P-type MOS transistor, a first pull-down -1 device PD1-1 such as an N-type MOS transistor, and a first pull-down -2 device PD1-2 such as an N-type MOS transistor. The second inverter includes a second pull-up device PL2 such as a P-type MOS transistor, a second pull-down -1 device PD2-1 such as an N-type MOS transistor, and a second pull-down -2 device PD2-2 such as an N-type MOS transistor. Drain nodes of the first pull-up device PL1, the first pull-down -1 device PD1-1 and the first pull-down -2 device PD1-2 are electrically connected to each other, defining a first data node Node1. Drain nodes of the second pull-up device PL2, the second pull-down -1 device PD2-1 and the second pull-down -2 device PD2-2 are electrically connected to each other, defining a second data node Node2. Gate nodes of the first pull-up device PL1, the first pull-down -1 device PD1-1 and the first pull-down -2 device PD1-2 are electrically connected to the second data node Node2. Gate nodes of the second pull-up device PL2, the second pull-down -1 device PD2-1 and the second pull-down -2 device PD2-2 are electrically connected to the first data node Node1. Source nodes of the first pull-down -1 device PD1-1, the first pull-down -2 device PD1-2, the second pull-down -1 device PD2-1 and the second pull-down -2 device PD2-2 are electrically connected to a first power line Vss. In one embodiment, the source nodes of the first pull-down -1 device PD1-1 and the first pull-down -2 device PD1-2 may be electrically connected to a first power line, while the source nodes of the second pull-down -1 device PD2-1 and the second pull-down -2 device PD2-2 are electrically connected to the other first power line, wherein the two first power lines are electrically connected to each other and constitute one same first power line Vss, but this is not limited thereto. Source nodes of the first pull-up device PL1 and the second pull-up device PL2 are electrically connected to a second power line Vcc.

The dual port static random access memory cell 100 may include a first port Port-A and a second port Port-B. The first port Port-A and the second port Port-B may both include at least one pass gate device. In this embodiment, the first port Port-A may include a first pass gate device PG1A and a third pass gate device PG2A, while the second port Port-B may include a second pass gate device PG1B and a fourth pass gate device PG2B. In this embodiment, the first pass gate device PG1A, the second pass gate device PG1B, the third pass gate device PG2A and the fourth pass gate device PG2B are all N-type MOS transistors, but this is not limited thereto.

More precisely, a drain node of the first pass gate device PG1A is electrically connected to a first bit-line Port-A BL. A source node of the first pass gate device PG1A is electrically connected to the first data node Node1. A gate node of the first pass gate PG1A is electrically connected to a first word-line port-A WL. A drain node of the second pass gate device PG1B is electrically connected to a second bit line Port-B BL. A source node of the second pass gate device PG1B is electrically connected to the first data node Node1. A gate node of the second pass gate device PG1B is electrically connected to a second word-line port-B WL. A drain node of the third pass gate device PG2A is electrically connected to a first bit-line-bar Port-A BLB. A source node of the third pass gate device PG2A is electrically connected to the second data node Node2. A gate node of the third pass gate device PG2A is electrically connected to the first word-line port-A WL. A drain node of the fourth pass gate device PG2B is electrically connected to a second bit-line-bar Port-B BLB. A source node of the fourth pass gate device PG2B is electrically connected to the second data node Node2. A gate node of the fourth pass gate device PG2B is electrically connected to the second word-line port-B WL. In this embodiment, the gate nodes of the first pass gate device PG1A and the third pass gate device PG2A are directly electrically connected to a common first word line port-A WL, and the gate nodes of the second pass gate device PG1B and the fourth pass gate device PG2B are directly electrically connected to a common second word line port-B WL. In other words, the first word line port-A WL connected to the gate node of the first pass gate device PG1A is electrically connected to the first word line port-A WL connected to the gate node of the third pass gate device PG2A, thereby constituting the common first word line port-A WL. The second word line Port-B WL connected to the gate node of the second pass gate device PG1B is electrically connected to the second word line port-B WL connected to the gate node of the fourth pass gate device PG2B, thereby constituting the common second word line Port-B WL.

According to the above, the ten MOS transistors may include other combinations of P-type MOS transistors and N-type MOS transistors, and planar transistors or multi-gate field effect transistors may be applied in the dual port static random access memory cell 100 of the present invention.

Figure 2:
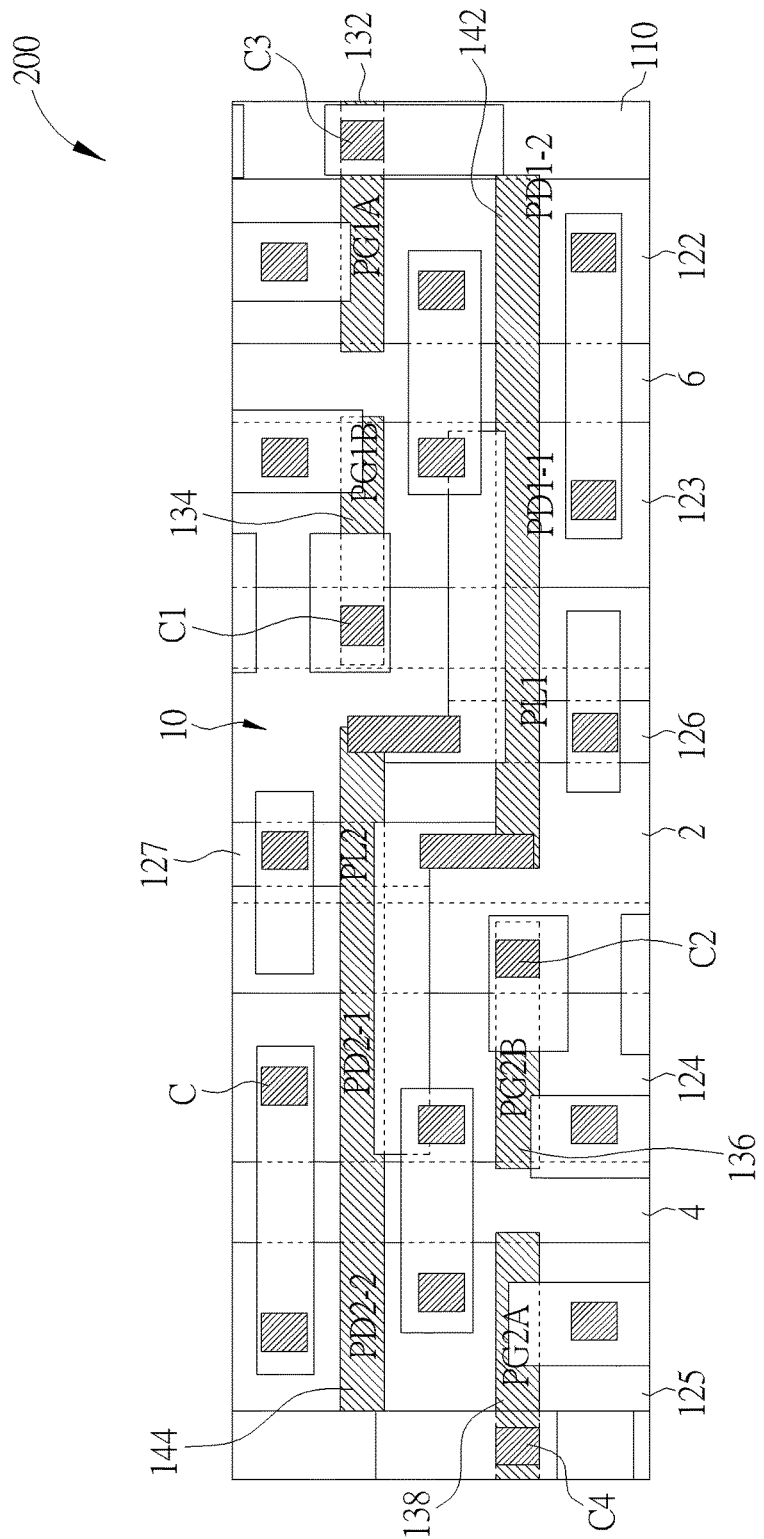
FIG. 2 depicts a layout diagram of a dual port static random access memory cell having planar transistors according to a preferred embodiment of the present invention.

FIG. 2 depicts a layout diagram of a dual port static random access memory cell having planar transistors according to a preferred embodiment of the present invention. A substrate 110 may include a first well 2, a second well 4 and a third well 6. In this embodiment, the first well 2 is an N-type well, the second well 4 is a P-type well, and the third well 6 is a P-type well, but this is not limited thereto. The substrate 110 may include a first active region 122, a second active region 123, a third active region 124, a fourth active region 125, a fifth active region 126 and a sixth active region 127. The first active region 122, the second active region 123, the third active region 124, the fourth active region 125, the fifth active region 126 and the sixth active region 127 are isolated from isolation structures. In this case, the first active region 122, the second active region 123, the third active region 124, the fourth active region 125, the fifth active region 126 and the sixth active region 127 are all rectangular shapes, thereby simplifying the layout, reducing processing costs, increasing the utilization efficiency of surface areas of the dual port static random access memory cell (meaning the surface areas of the first active region 122, the second active region 123, the third active region 124, the fourth active region 125, the fifth active region 126 and the sixth active region 127 can be increased in a same surface area of the dual port static random access memory cell), and decreasing degrading effects due to complex layouts, but this is not limited thereto. The reading current (Iread) can be increased or reduced by adjusting the surface areas of the first active region 122, the second active region 123, the third active region 124, the fourth active region 125, the fifth active region 126 and the sixth active region 127. In a preferred embodiment, the first active region 122, the second active region 123, the third active region 124 and the fourth active region 125 have the same surface areas, and the fifth active region 126 and the sixth active region 127 have the same surface areas, therefore constituting a symmetric layout, enabling a symmetric dual port static random access memory cell 200 to be formed on these active regions. This simplifies processes, enhances reading speed, improves bit line coupling and maintains a same layout area of the dual port static random access memory cell 200.

In this embodiment, the first active region 122 includes the first pass gate device PG1A and the first pull-down -2 device PD1-2, the second active region 123 includes the second pass gate device PG1B and the first pull-down -1 device PD1-1, the third active region 124 includes the fourth pass gate device PG2B and the second pull-down -1 device PD2-1, the fourth active region 125 includes the third pass gate device PG2A and the second pull-down -2 device PD2-2, the fifth active region 126 includes the first pull-up device PL1, and the sixth active region 127 includes the second pull-up device PL2.

Figure 3:
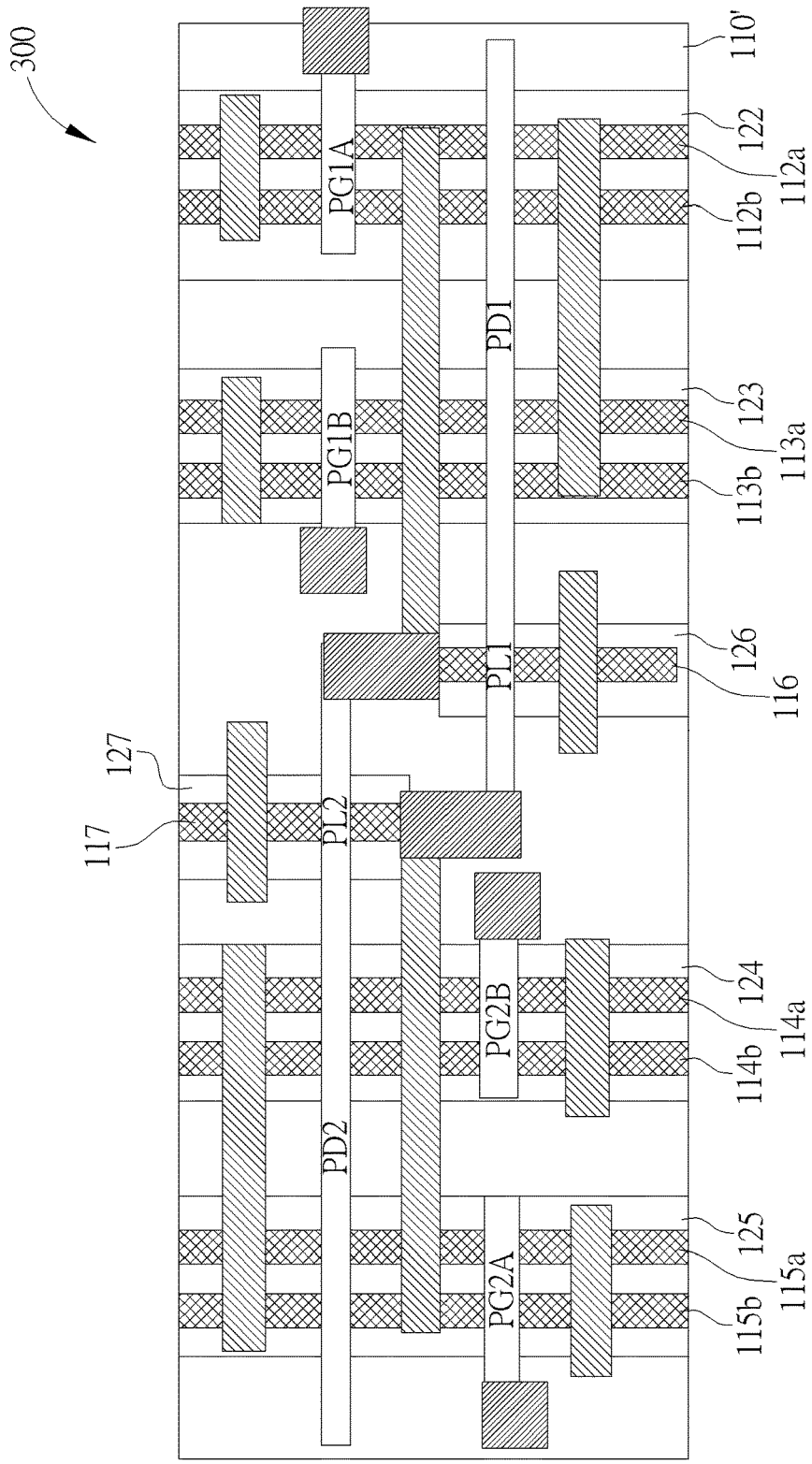
FIG. 3 depicts a layout diagram of a dual port static random access memory cell having fin field effect transistors according to a preferred embodiment of the present invention.

The ten transistors of FIG. 2 are formed on a planar substrate 110 to constitute the dual port static random access memory cell 200. FIG. 3 depicts a layout diagram of a dual port static random access memory cell having fin field effect transistors according to a preferred embodiment of the present invention. The present invention can also be applied in ten transistors formed on a fin-shaped substrate 110' to constitute a dual port static random access memory cell 300. As shown in FIG. 3, the substrate 110' may include fin-shaped structures 112a/112b/113a/113b/114a/114b/115a/115b/116/117.

The first active region 122 may include the fin-shaped structures 112a/112b, and the first pass gate device PG1A and the first pull-down device PD1 including the first pull-down -2 device PD1-2 are disposed across the fin-shaped structures 112a/112b. The second active region 123 may include the fin-shaped structures 113a/113b, and the second pass gate device PG1B and the first pull-down device PD1 including the first pull-down -1 device PD1-1 are disposed across the fin-shaped structures 113a/113b. The third active region 124 may include the fin-shaped structures 114a/114b, and the fourth pass gate device PG2B and the second pull-down device PD2 including the second pull-down -1 device PD2-1 are disposed across the fin-shaped structures 114a/114b. The fourth active region 125 may include the fin-shaped structures 115a/115b, and the third pass gate device PG2A and the second pull-down device PD2 including the second pull-down -2 device PD2-2 are disposed across the fin-shaped structures 115a/115b. The fifth active region 126 may include the fin-shaped structure 116, and the first pull-up device PL1 is disposed across the fin-shaped structure 116. The sixth active region 127 may include the fin-shaped structure 117, and the second pull-up device PL2 is disposed across the fin-shaped structure 117. In this embodiment, every transistor in the first active region 122, the second active region 123, the third active region 124 and the fourth active region 125 is disposed across two fin-shaped structures, and every transistor in the fifth active region 126 and the sixth active region 127 is disposed across one single fin-shaped structure, but this is not limited thereto.

Materials and metal structures of the dual port static random access memory cell 300 of FIG. 3 having fin shaped transistors and materials and metal structures of the dual port static random access memory cell 200 of FIG. 2 having planar transistors are the same, thereby only FIG. 2 is described.

Referring to FIG. 2, the first pass gate device PG1A, the second pass gate device PG1B, the third pass gate device PG2A and the fourth pass gate device PG2B have a gate structure 132 disposed over the first active region 122, a gate structure 134 disposed over the second active region 123, a gate structure 136 disposed over the third active region 124, and a gate structure 138 disposed over the fourth active region 125, wherein the gate structures extend from these active regions. The first pull-up device PL1, the first pull-down -1 device PD1-1 and the first pull-down -2 device PD1-2 have one same gate structure 142 disposed over the fifth active region 126, the second active region 123 and the first active region 122. The second pull-down -2 device PD2-2, the second pull-down -1 device PD2-1 and the second pull-up device PL2 have one same gate structure 144 disposed over the fourth active region 125, the third active region 124 and the sixth active region 127, but this is not limited thereto. A plurality of contact plugs C1/C2/C3/C4/C are connected to metal layers (meaning interconnects) in an upwards direction. The metal layers may include the first power line, the second power line, the first word line, the second word line, the first bit line, the first bit line bar, the second bit line and the second bit line bar etc. In a preferred embodiment, the first power line, the second power line, the first word line, the second word line, the first bit line, the first bit line bar, the second bit line and the second bit line bar are one same metal layer, but this is not limited thereto.

Figure 4:
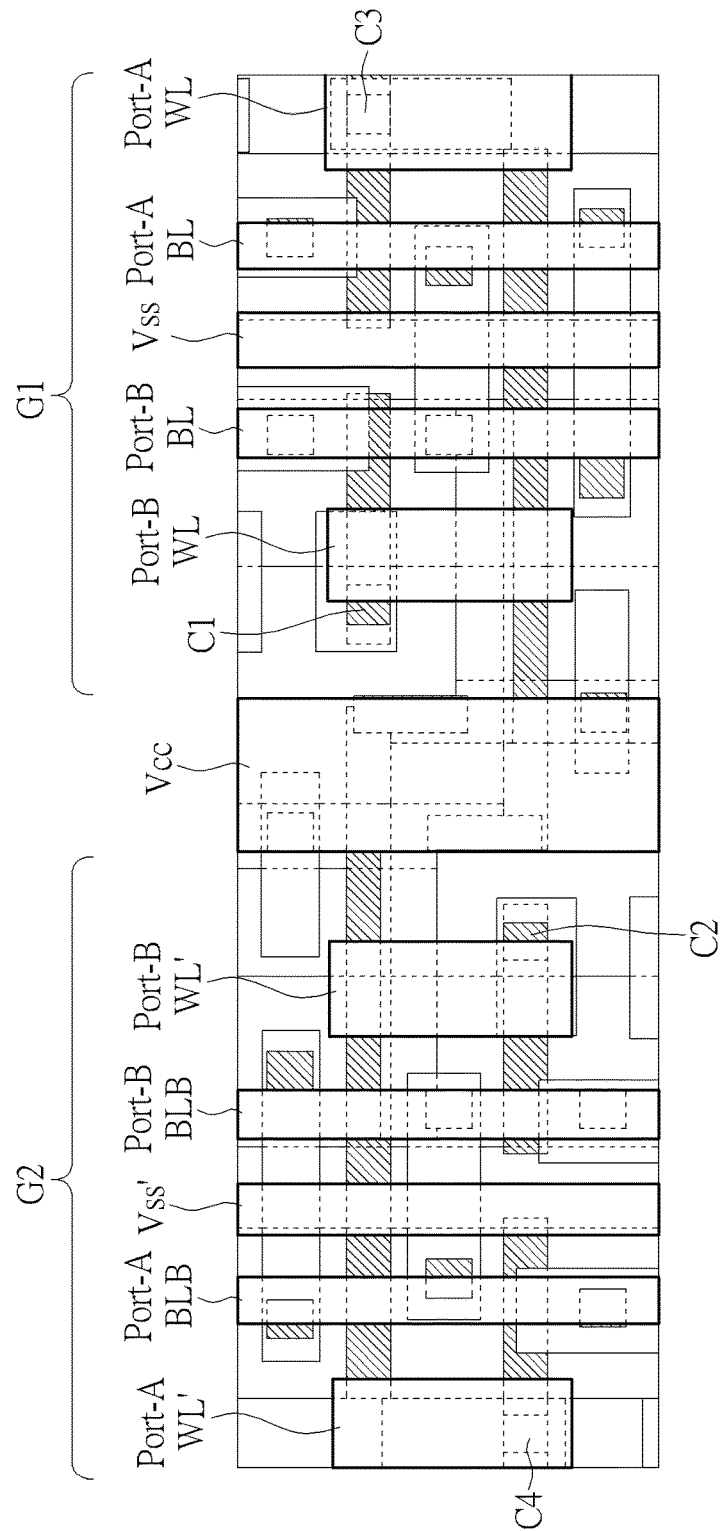
FIG. 4 depicts a metal line layout diagram of a dual port static random access memory cell according to a preferred embodiment of the present invention.

FIG. 4 depicts a metal line layout diagram of a dual port static random access memory cell according to a preferred embodiment of the present invention.

The first power line Vss is electrically connected to the source nodes of the first pull-down -1 device PD1-1 and the first pull-down -2 device PD1-2 is disposed between the first word line port-A WL electrically connected to the gate node of the first pass gate device PG1A, and the second word line port-B WL is electrically connected to the gate node of the second pass gate device PG1B. The first bit line Port-A BL electrically connected to the drain node of the first pass gate device PG1A is disposed between the first power line Vss and the first word line port-A WL. The second bit line Port-B BL electrically connected to the drain node of the second pass gate device PG1B is disposed between the first power line Vss and the second word line port-B WL. In this way, the first power line Vss, the first word line port-A WL, the second word line port-B WL, the first bit line Port-A BL and the second bit line Port-B BL constitute a first group G1.

The other (A symmetric) first power line Vss' (the other first power line Vss' electrically connected to the first power line Vss) is electrically connected to the source nodes of the second pull-down -1 device PD2-1 and the second pull-down -2 device PD2-2, which are disposed between the other (a symmetric) first word line Port-A WL' (the other first word line Port-A WL' electrically connected to the first word line port-A WL) electrically connected to the gate node of the third pass gate device PG2A and the other (a symmetric) second word line Port-B WL' (the other second word line Port-B WL' electrically connected to the second word line port-B WL) electrically connected to the gate node of the fourth pass gate device PG2B. The first bit line bar Port-A BLB electrically connected to the drain node of the third pass gate device PG2A is disposed between the other first power line Vss' and the other first word line Port-A WL'. The second bit line bar Port-B BLB electrically connected to the drain node of the fourth pass gate device PG2B is disposed between the other first power line Vss' and the other second word line Port-B WL'. In this way, the other first power line Vss', the other first word line Port-A WL', the other second word line Port-B WL', the first bit line bar Port-A BLB and the second bit line bar Port-B BLB constitute a second group G2.

Thereby, the first port Port-A may include the two first word line port-A WL/Port-A WL', the first bit line Port-A BL and the first bit line bar Port-A BLB, and the second port Port-B may include the two second word line port-B WL/Port-B B WL', the second bit line Port-B BL and the second bit line bar Port-B BLB.

The first group G1 and the second group G2 are preferably disposed at two opposite sides of the second power line Vcc electrically connected to the source nodes of the first pull-up device PL1 and the second pull-up device PL2. In this embodiment, the second power line Vcc is disposed directly next to the two second word line port-B WL/Port-B WL', but the second power line Vcc may be disposed directly next to the two first word line port-A WL/Port-A WL' instead in another embodiment. Preferably, the other first power line Vss', the other first word line Port-A WL', the other second word line Port-B WL', the first bit line bar Port-A BLB and the second bit line bar Port-B BLB are mirror symmetric to the first power line Vss, the first word line port-A WL, the second word line port-B WL, the first bit line Port-A BL and the second bit line Port-B BL by the second power line Vcc. In this way, the dual port static random access memory cell of the present invention has a symmetric metal interconnect layout, and thus has a symmetric read current (Iread) distribution. This enhances reading speed, improves bit line coupling, and maintains a same layout area.

In this embodiment, as shown in FIG. 2 and FIG. 4, a second word line contact C1 physically connecting the second word line port-B WL is disposed between the first pull-up device PL1 and the first pull-down -1 device PD1-1, and the other second word line contact C2 physically connecting the other second word line Port-B WL' is disposed between the second pull-up device PL2 and the second pull-down -1 device PD2-1. A first word line contact C3 physically connecting the first word line port-A WL and a first word line contact C4 physically connecting the other first word line Port-A WL' are disposed at the outer sides of the first pass gate device PG1A and the third pass gate device PG2A, respectively.

Figure 5:
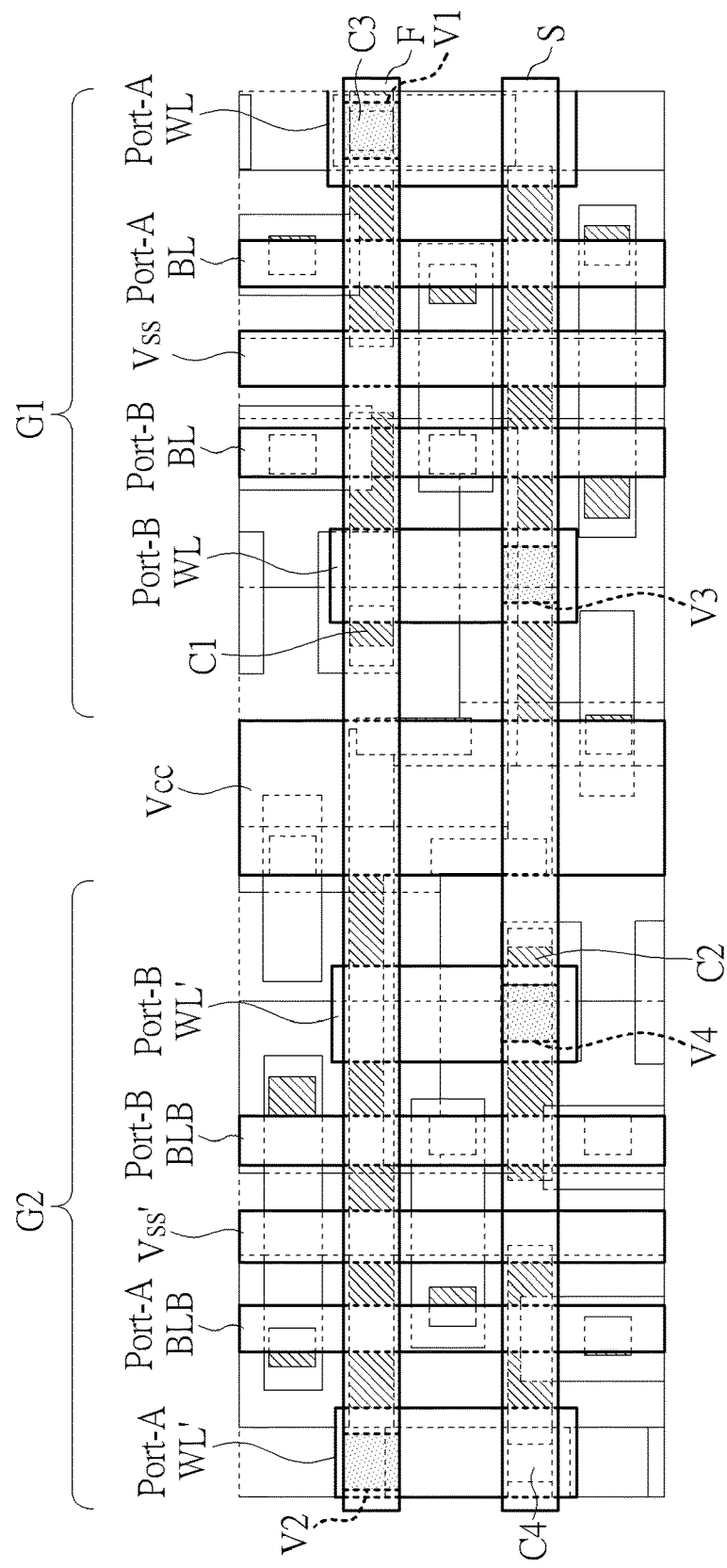
FIG. 5 depicts a metal line layout diagram of a dual port static random access memory cell according to a preferred embodiment of the present invention.

Furthermore, as shown in FIG. 1 and FIG. 5, the first word line port-A WL and the other first word line Port-A WL' of FIG. 5 can be electrically connected by a metal line F through a via V1 and a via V2 to form the common first word line port-A WL of FIG. 1, and the second word line port-B WL and the other second word line Port-B WL' of FIG. 5 can be electrically connected by a metal line S through a via V3 and a via V4 to form the common second word line port-B WL of FIG. 1.

To summarize, the present invention provides a dual port static random access memory cell, which includes a first power line located between a first word line and a second word line, a first bit line located between the first power line and the first word line, and a second bit line located between the first power line and the second word line, thus constituting a first group. Therefore, the dual port static random access memory cell of the present invention has a symmetric metal interconnect layout, and has a symmetric read current (Iread) distribution. This enhances reading speed in a same layout area, reduces resistance and improves bit line coupling.

Furthermore, the dual port static random access memory cell of the present invention also includes the other first power line disposed between the other first word line and the other second word line, a first bit line bar disposed between the other first power line and the other first word line, and a second bit line bar disposed between the other first power line and the other second word line. This constitutes a second group. As the first group and the second group are located at opposite sides of a second power line, or as the other first power line, the other first word line, the other second word line, the first bit line bar and the second bit line bar are mirror symmetric to the first power line, the first word line, the second word line, the first bit line and the second bit line by the second power line, the metal interconnect layout of the dual port static random access memory cell can be distributed symmetrically by the second power line, therefore achieving a symmetric read current (Iread) distribution.

Figure 6:
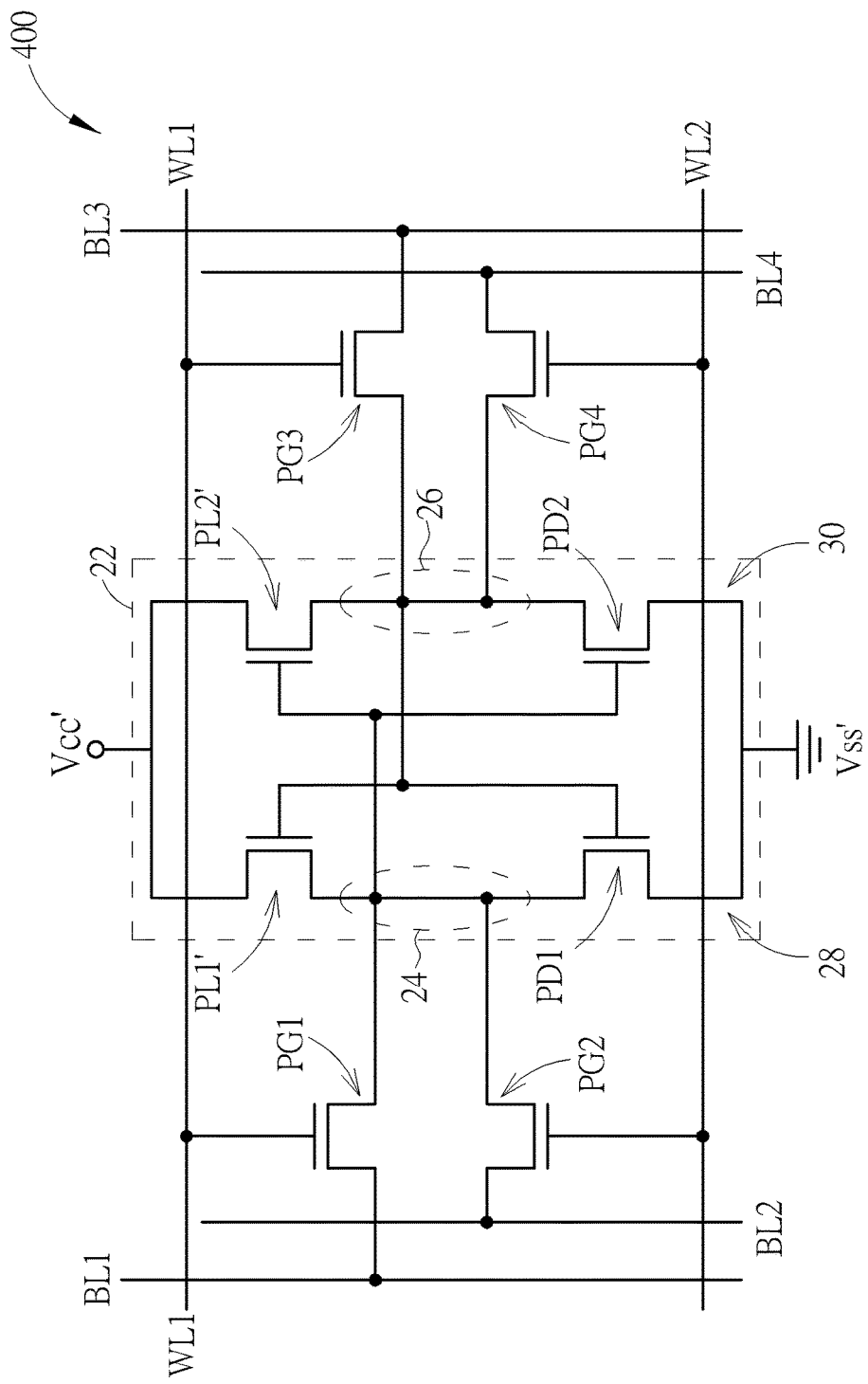
FIG. 6 depicts a circuit diagram of an eight-transistor SRAM (8T-SRAM) cell according to an embodiment of the present invention.
Figure 7:
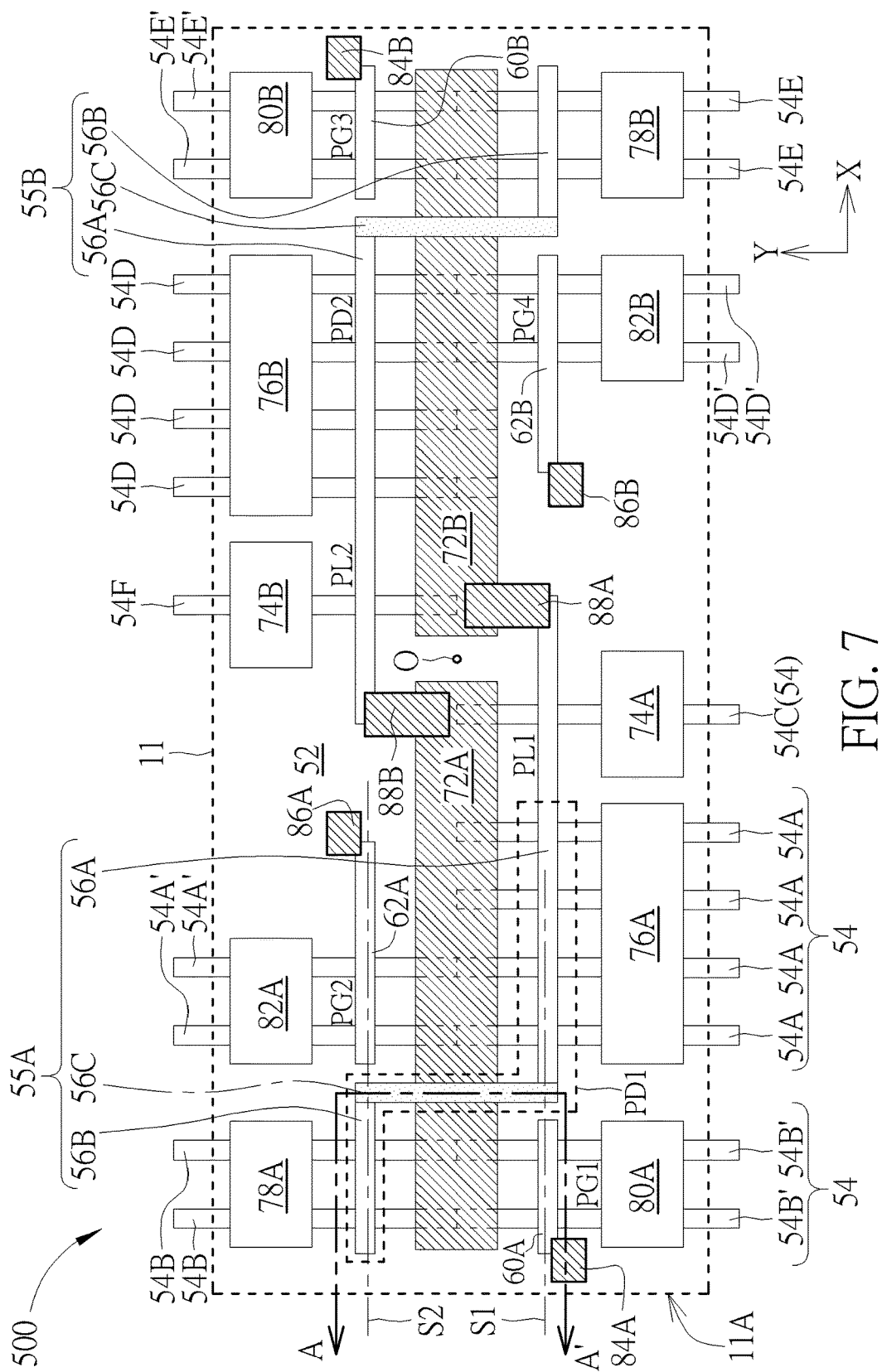
FIG. 7 depicts a layout diagram of a dual port static random access memory cell having fin field effect transistors according to a preferred embodiment of the present invention.

The present invention also provides a dual port static random access memory cell having a mirror symmetric metal line layout. FIG. 6 depicts a circuit diagram of an eight-transistor SRAM (8T-SRAM) cell according to an embodiment of the present invention. FIG. 7 depicts a layout diagram of a dual port static random access memory cell having fin field effect transistors according to a preferred embodiment of the present invention.

As shown in FIG. 6, in this embodiment, each 8T-SRAM cell 400 is composed of a first pull-up device PL1', a second pull-up device PL2', a first pull-down device PD1, a second pull-down device PD2, a first pass gate device PG1, a second pass gate device PG2, a third pass gate device PG3 and a fourth pass gate device PG4. These eight transistors constitute a set of flip-flops. The first and the second pull-up devices PL1' and PL2', and the first and the second pull-down devices PD1 and PD2 constitute a latch circuit that stores data in the storage nodes 24 and 26. Since the first and the second pull-up devices PL1' and PL2' act as power load devices, they can be replaced by resistors. Under this circumstance, the static random access memory becomes a four-transistor SRAM (4T-SRAM). In this embodiment, the first and the second pull-up devices PL1' and PL2' preferably share a source/drain region and electrically connect to a second power line Vcc', and the first and the second pull-down devices PD1 and PD2 share a source/drain region and electrically connect to a first power line Vss'.

Preferably, the first and the second pull-up devices PL1' and PL2' of the 8T-SRAM cell 400 are composed of p-type metal oxide semiconductor (PMOS) transistors; the first and the second pull-down devices PD1 and PD2, the first pass gate devices PG1, the second pass gate devices PG2, the third pass gate devices PG3 and the fourth pass gate devices PG4 composed of n-type metal oxide semiconductor (NMOS) transistors, but not limited thereto. The first pull-up device PL1' and the first pull-down device PD1 constitute an inverter, which further form a series circuit 28. One end of the series circuit 28 is connected to a second power line Vcc' and the other end of the series circuit 28 is connected to a first power line Vss'. Similarly, the second pull-up device PL2' and the second pull-down device PD2 constitute another inverter and a series circuit. One end of the series circuit is connected to the second power line Vcc' and the other end of the series circuit is connected to the first power line Vss'. Each pass gate devices (including the first pass gate device PG1, the second pass gate device PG2, the third pass gate device PG3 and the fourth pass gate device PG4) configured with the two cross-coupled inverters respectively, wherein each of the at least one pull-up device (PLs), the at least one pull-down devices (PDs), and the at least two pass gate device (PGs) includes a fin field-effect transistor (FinFET).

The storage node 24 is connected to the respective gates of the second pull-down device PD2 and the second pull-up device PL2'. The storage node 24 is also connected to the drains of the first pull-down device PD1, the first pull-up device PL1', the first pass gate device PG1 and the second pass gate device PG2. Similarly, the storage node 26 is connected to the respective gates of the first pull-down device PD1 and first the pull-up device PL1. The storage node 26 is also connected to the drains of the second pull-down device PD2, the second pull-up device PL2', the third pass gate device PG3 and the fourth pass gate device PG4. The gates of the first pass gate device PG1 and the third pass gate device PG2 are respectively coupled to a first word line WL1; the gates of the second pass gate device PG2 and the fourth pass gate device PG4 are respectively coupled to a second word line WL2; the source of the first pass gate device PG1 is coupled to a bit line BL1; the source of the second pass gate device PG2 is coupled to a bit line BL2; the source of the third pass gate device PG3 is coupled to a bit line BL3; and the source of the fourth pass gate device PG4 is coupled to a bit line BL4.

As shown in FIG. 7, in this embodiment, an 8T-SRAM cell 500 is disposed on a substrate 52, such as a silicon substrate or silicon-on-insulator (SOI) substrate. A plurality of fin structures 54 may be formed on the substrate 52. In addition, a shallow trench isolation (STI, not shown) is disposed between each fin structure 54.

Generally, one fin transistor includes a gate structure crossing over at least one fin structure. However, if one gate structure crosses over a plurality of paralleled arranged fin structures, in the equivalent circuit, it's equal to a plurality of transistors connected in parallel to each other, thereby helping to increase the channel width of the fin transistor, and the read current (Iread) of one fin transistor can also be improved, so as to improve the operation speed of the whole SRAM (due to one SRAM includes a plurality of fin transistors).

A key feature of the present invention is that each inverter includes a step-shaped structure. More precisely, the invention further includes at least two step-shaped (when viewed in a top view) gate structures 55A, 55B disposed on the substrate 52, and the two step-shaped structures 55A, 55B are symmetrically arranged (symmetrically arranged according to the center point O in FIG. 2). To simplify the description, this embodiment only describes one of the step-shaped structures 55A. Except for the symmetrical arrangement, the other characteristics of the two step-shaped structures 55A, 55B are completely identical.

Both the step-shaped structures 55A and the step-shaped structures 55B includes a first part 56A, a second part 56B and a bridge part 56C which is connected to the first part 56A and the second part 56B. More precisely, the first part 56A and the second part 56B of the step-shaped structure 55A are arranged along a first direction (such as the X-direction in FIG. 7), and the bridge part 56C of the step-shaped structure 55A is disposed between the first part 56A and the second part 56B and electrically connected to the first part 56A and the second part 56B, and is arranged along a second direction (such as the Y-direction in FIG. 7). The first direction and the second direction are preferably perpendicular to each other, but not limited thereto. In addition, the first part 56A and the second part 56B of the step-shaped structure 55A comprise different symmetry axes. In other words, the shortest distance between the first part 56A and the second part 56B of the step-shaped structure 55A is substantially equal to the length of the bridge part 56C (while the bridge part 56C is perpendicular to the first part 56A or the second part 56B).

It is noteworthy that the 8T-SRAM cell 500 is disposed within a specific range 11, in other words, the specific range 11 only includes one 8T-SRAM cell 500 disposed therein. The second part 56B is disposed adjacent to one edge of the specific range 11 (such as the edge 11A shown in FIG. 7).

The step-shaped structures 55A, 55B crosses over a plurality of fin structures 54. Here the fin structures 54 are labeled as the first fin structures 54A, the second fin structures 54B, the third fin structure 54C, the fourth fin structures 54D, the fifth fin structures 54E and the sixth fin structure 54F. In addition, this embodiment further includes at least one fin structure 54A', at least one fin structure 54B', at least one fin structure 54D' and at least one fin structure 54E' disposed on the substrate 52. The step-shaped structures 55A crosses over the first fin structures 54A, the second fin structures 54B and the third fin structure 54C, and the step-shaped structures 55B crosses over the fourth fin structures 54D, the fifth fin structures 54E and the sixth fin structure 54F. It is noteworthy that in this embodiment, there are more than one first fin structure 54A, second fin structure 54B, fourth fin structures 54D and fifth fin structures 54E, including four parallel arranged first fin structures 54A, two parallel arranged second fin structures 54B, one third fin structure 54C, four parallel arranged fourth fin structures 54D, two parallel arranged fifth fin structures 54E and one sixth fin structure 54F. However, the amount of the first fin structures 54A, the second fin structures 54B, the third fin structure 54C, the fourth fin structures 54D, the fifth fin structures 54E, the sixth fin structure 54F and the fin structures 54A', 54B', 54D' and 54E' may include any integer greater than or equal to 1, and it can be adjusted according to actual requirements.

In this embodiment, the first part 56A of the step-shaped structure 55A crosses over the first fin structures 54A and the third fin structure 54C, and the second part 56B of the step-shaped structure 55A crosses over the second fin structures 54B. The portion that the first part 56A crosses over the third fin structure 54C constitutes a gate of the first the pull-up device PL1'. In addition, the portion that the first part 56A crosses over the first fin structures 54A, and the portion that the second part 56B crosses over the second fin structures 54B constitutes a gate of the first the pull-down device PD1 (the range of the dotted line in FIG. 7 shows the range of the first the pull-down device PD1).

Therefore, in terms of the first pull-down device PD1, which includes the step-shaped structure 55A, and the step-shaped structure 55A crosses over total six fin structures (including the first part 56A crosses four first fin structures 54A, and the second part 56B crosses two second fin structures 54B). In this way, in a limited range, the gate can cross more fin structures. This increases the channel width of the first pull-down device PD1, and the read current (Iread) of one first pull-down device PD1 can also be improved, so as to improve the read speed of the first pull-down device PD1.

Besides the step-shaped structures 55A and 55B, each inverter further includes a pass gate structure and a second pass gate structure. More precisely, the 8T-SRAM cell 400 also includes two symmetrically arranged first pass gate structures 60A, 60B and two symmetrically arranged second pass gate structures 62A, 62B disposed on the substrate 52. To simplify the description, this embodiment only describes the first pass gate structures 60A and the second pass gate structures 62A. Except for the symmetrical arrangement, the other characteristics of the two first pass gate structures 60A, 60B and the two second pass gate structures 62A, 62B are completely identical.

Preferably, the first pass gate structure 60A is arranged along the first direction, and it's also arranged along the extending direction of the first part 56A. In other words, the first part 56A and the first pass gate structure 60A have a same symmetry axis S1. The first pass gate structure 60A crosses over the fin structures 54B', to constitute the gate of the first pass gate device PG1 mentioned above. In addition, the bridge part 56C is disposed between the first pass gate structure 60A and the first part 56A. Similarly, another first pass gate structure 60B crosses over other fin structures 54E', to constitute the gate of the third pass gate device PG3 mentioned above.

Similarly, the second pass gate structure 62A is also arranged along the first direction, and it's arranged along the extending direction of the second part 56B. In other words, the second part 56B and the second pass gate structure 62A have a same symmetry axis S2. The second pass gate structure 62A crosses over the fin structures 54A', to constitute the gate of the second pass gate device PG2 mentioned above. In addition, the bridge part 56C is disposed between the second pass gate structure 62A and the second part 56B. Similarly, another second pass gate structure 62B crosses over other fin structures 54D', to constitute the gate of the fourth pass gate device PG4 mentioned above.

Therefore, as shown in FIG. 7, when viewed in a top view, the step-shaped structures 55A and 55B has a "step-shaped" or a "Z-shaped" profile. The first pass gate structure 60A and the second pass gate structure 62A are disposed on two sides of the step-shaped structures 55A. For example, the first pass gate structure 60A is disposed on the left-lower side of the step-shaped structures 55A, and the second pass gate structure 62A is disposed on the right-upper side of the step-shaped structures 55A.

Besides the fin structures and the gate structures mentioned above, the 8T-SRAM cell 500 further includes a plurality of contact structures, including two symmetrically arranged extending contact structures 72A and 72B, the extending contact structure 72A crosses over each first fin structure 54A, each second fin structure 54B and each the third fin structure 54C, the extending contact structure 72B crosses over each fourth fin structure 54D, each fifth fin structure 54E and each sixth fin structure 54F, to electrically connect each parallel arranged fin structure together. Please also refer to FIG. 6, where the extending contact structure 72A electrically connects to the drain of the first pull-down device PD1, the first pull-up device PL1', the first pass gate device PG1 and the second pass gate device PG2, thereby constituting the storage node 24, meaning a first node (Node 1); the extending contact structure 72B electrically connects to the drain of the second pull-down device PD2, the second pull-up device PL2', the third pass gate device PG3 and the fourth pass gate device PG4, thereby constituting the storage node 26, meaning a second node (Node 2). Besides, when viewed in a top view, the shape of the extending contact structures 72A, 72B may be a strip shape or other shapes (such as L-shaped), and the present invention is not limited thereto.

Furthermore, the other contact structures disposed on the substrate 52 include:

The contact structures 74A, 74B, the contact structure 74A electrically connected to each third fin structure 54C, and also electrically connected to the second power line Vcc', the contact structure 74B electrically connected to each sixth fin structure 54F, and also electrically connected to the second power line Vcc' (please refer to FIG. 6, where the contact structures 74A, 74B are electrically connected to the source of the first pull-up device PL1' and the second pull-up device PL2' to the second power line Vcc').

The contact structures 76A, 76B, the contact structure 76A crosses over each first fin structure 54A, and is electrically connected to the first power line Vss', the contact structure 76B crosses over each fourth fin structure 54D, and is electrically connected to the first power line Vss' (please refer to FIG. 6, where the contact structures 76A, 76B are electrically connected to the source of the first pull-down device PD1 and the second pull-down device PD2 to the first power line Vss').

The contact structures 78A, 78B, the contact structure 78A crosses over each second fin structure 54B, and is electrically connected to the first power line Vss', the contact structure 78B crosses over each fifth fin structure 54E, and is electrically connected to the first power line Vss' (please refer to FIG. 6, where the contact structures 78A, 78B are electrically connected to the source of the first pull-down device PD1 and the second pull-down device PD2 to the first power line Vss').

The contact structures 80A, 80B, the contact structure 80A crosses over each second fin structure 54B', and is electrically connected to the bit line BL1, the contact structure 80B crosses over each fifth fin structure 54E', and is electrically connected to the bit line BL3 (please refer to FIG. 6, where the contact structure 80A is electrically connected to the source of the first pass gate device PG1 to the bit line BL1, and the contact structure 80B is electrically connected to the source of the third pass gate device PG3 to the bit line BL3).

The contact structures 82A, 82B, the contact structure 82A crosses over each first fin structure 54A', and is electrically connected to the bit line BL2, the contact structure 82B crosses over each fourth fin structure 54D', and is electrically connected to the bit line BL4 (please refer to FIG. 6, where the contact structure 82A is electrically connected to the source of the second pass gate device PG2 to the bit line BL2, and the contact structure 82B is electrically connected to the source of the fourth pass gate device PG4 to the bit line BL4).

The contact structures 84A, 84B, the contact structure 84A disposed on each first pass gate structure 60A, and electrically connected to the word line WL1, the contact structure 84B disposed on each first pass gate structure 60B, and electrically connected to the word line WL1 (please refer to FIG. 6, where the contact structure 84A is electrically connected to the gate of the first pass gate device PG1 and the third pass gate device PG3 to the word line WL1).

The contact structures 86A, 86B, the contact structure 86A disposed on each second pass gate structure 62A, and electrically connected to the word line WL2, the contact structure 86B disposed on each second pass gate structure 62B, and electrically connected to the word line WL2 (please refer to FIG. 6, where the contact structure 86A is electrically connected to the gate of the second pass gate device PG2 and the fourth pass gate device PG4 to the word line WL2).

The contact structures 88A, 88B, the contact structure 88B disposed on the third fin structure 54C, and electrically connected to the step-shaped structure 55A and the extending contact structure 72A, the contact structure 88A disposed on the sixth fin structure 54F, and electrically connected to the step-shaped structure 55B and the extending contact structure 72B (please refer to FIG. 6, where the contact structure 88A is electrically connected to the gate of the first pull-up device PL1' to the storage node 26, and the contact structure 88B is electrically connected to the gate of the second pull-up device PL2' to the storage node 24). In addition, the contact structure 88A and the extending contact structure 72A may be formed in a same level and contact to each other directly, therefore, the contact structure 88A and the extending contact structure 72A are a monolithically formed structure. Similarly, the contact structure 88B and the extending contact structure 72B may be a monolithically formed structure too. Besides, the contact structures mentioned above are also arranged symmetrically, and will not be described again.

A key feature of this embodiment is that the first part 56A and the second part 56B of the step-shaped structure 55A (or the step-shaped structure 55B) have different symmetry axes, but they cross over the first fin structures 54A and the second fin structures 54B respectively, to constitutes a gate of the first the pull-down device PD1.

In terms of the first pull-down device PD1, which includes the step-shaped structure 55A, and the step-shaped structure 55A crosses over total six fin structures (including the first part 56A crossing four first fin structures 54A, and the second part 56B crossing two second fin structures 54B). In other words, the gate structure of first pull-down device PD1 is not limited to being a strip-shaped structure, and it can be designed to be a step-shaped structure or other shapes. In this way, in a limited range, the gate can cross more fin structures. This increases the channel width of the first pull-down device PD1, and the read current (Iread) of one first pull-down device PD1 can also be improved, so as to improve the read speed of the first pull-down device PD1.

Figure 8:
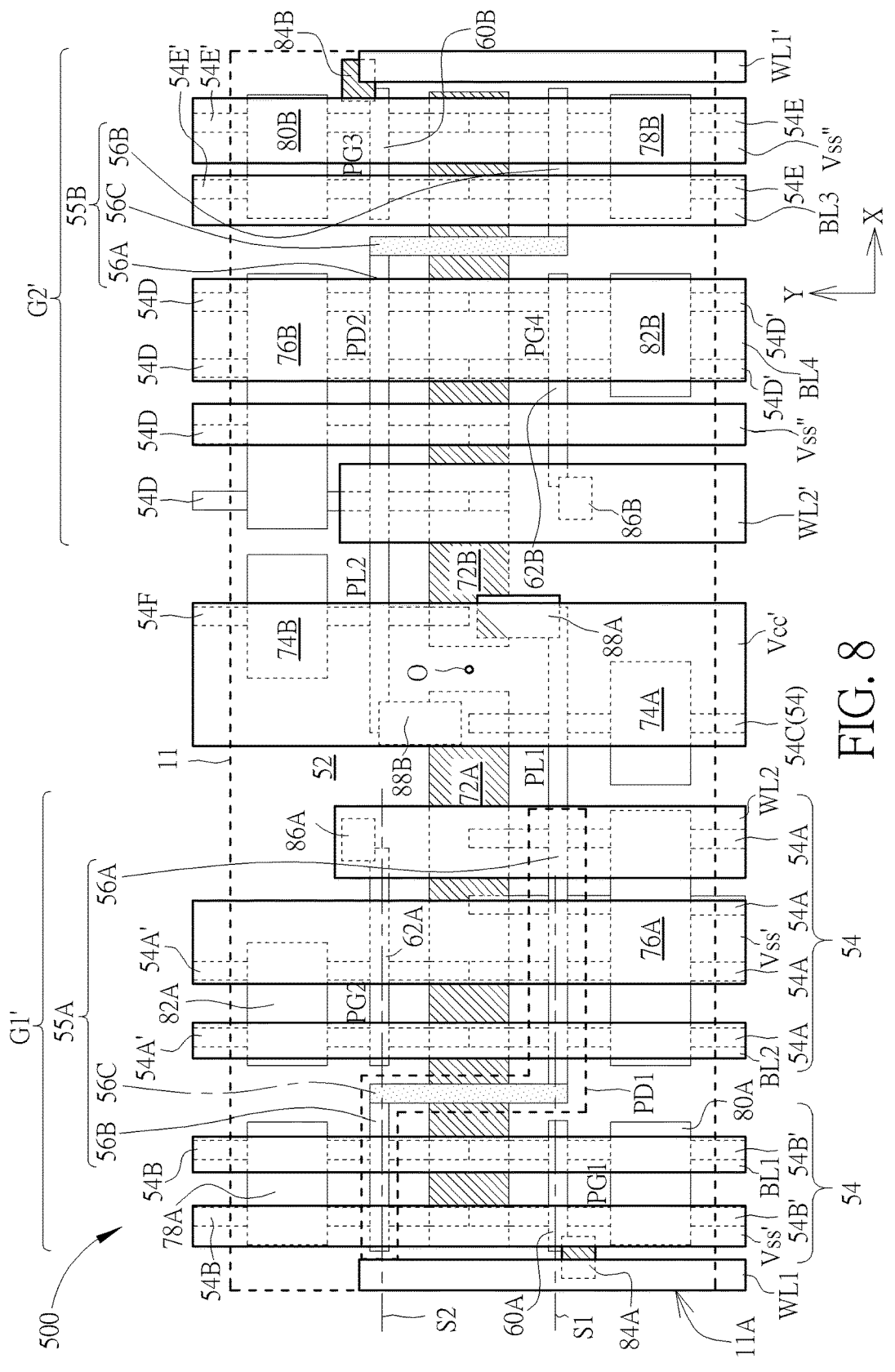

A layout of the first power line Vss', the second power line Vcc', the bit line BL1, the bit line BL2, the bit line BL3, the bit line BL4, the word line WL1 and the word line WL2 on the dual port static random access memory cell having fin field effect transistors of FIG. 7 is presented. FIG. 8 depicts a metal line layout diagram of a dual port static random access memory cell according to a preferred embodiment of the present invention. As shown in FIG. 8, a (first) bit line BL1 and a (second) bit line BL2 are disposed between a (first) word line WL1 and a (second) word line WL2, wherein the bit line BL1 is adjacent to the word line WL1 and the bit line BL2 is adjacent to the word line WL2. In other words, the bit line BL1 is closer to the word line WL1 than the bit line BL2, and the bit line BL2 is closer to the word line WL2 than the bit line BL1. Two first power line Vss' are disposed between the bit line BL1 and the word line WL1, and between the bit line BL2 and the word line WL2, respectively. That is, one of the first power line Vss' is disposed between the bit line BL1 and the word line WL1, and the other of the first power line Vss' is disposed between the bit line BL2 and the word line WL2. Thereby, the bit line BL1, the bit line BL2, the word line WL1, the word line WL2 and two of the first power line Vss' constitute a first group G1'.

A (first corresponding) bit line BL3 and a (second corresponding) bit line BL4 are disposed between the other (a symmetric first) word line WL1' and the other (a symmetric second) word line WL2'. The bit line BL3 is adjacent to the other word line WL1', and the bit line BL4 is adjacent to the other word line WL2'. The other two (symmetric first) power line Vss'' are disposed between the bit line BL3 and the other word line WL1', and between the bit line BL4 and the other word line WL2'. Thereby, the bit line BL3, the bit line BL4, the other word line WL1', the other word line WL2' and two of the other first power line Vss' constitute a second group G2'.

A second power line Vcc' is disposed between the first group G1' and the second group G2'. The first group G1' is preferably mirror symmetric to the second group G2' by the second power line Vcc'. That is, the bit line BL3, the bit line BL4, the other word line WL1', the other word line WL2' and two of the other first power line Vss' are mirror symmetric to the bit line BL1, the bit line BL2, the word line WL1, the word line WL2 and two of the first power line Vss' by the second power line Vcc'. In one case, the second power line Vcc' are right next to the word line WL2 and the other word line WL2'. A first port includes two of the word lines WL1, the bit line BL1 and the bit line BL3, and a second port includes two of the word lines WL2, the bit line BL2 and the bit line BL4.

In this embodiment, the word line WL1 and the other word line WL1' are electrically connected to each other and constitute a common word line (WL1 of FIG. 6), and the word line WL2 and the other word line WL2' are electrically connected to each other and constitute a common word line (WL2 of FIG. 6). Two of the first power lines Vss' and two of the other first power lines Vss' are electrically connected to each other and constitute a common first power line (Vss' of FIG. 6). In a preferred embodiment, four first power lines Vss'/Vss'', one second power line Vcc', two word lines WL1/WL2 and four bit lines BL1/BL2/BL3/BL4 are in one same metal layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dual port static random access memory cell, comprising:
   a first power line disposed between a first word line and a second word line;
   a first bit line disposed between the first word line and the first power line;
   a second bit line disposed between the second word line and the first power line, wherein the first power line, the first word line, the second word line, the first bit line and the second bit line constitute a first group;
   a symmetric first power line disposed between a symmetric first word line and a symmetric second word line;
   a first bit line bar disposed between the symmetric first word line and the symmetric first power line;
   a second bit line bar disposed between the symmetric second word line and the symmetric first power line, wherein the symmetric first power line, the symmetric first word line, the symmetric second word line, the first bit line bar and the second bit line bar constitute a second group; and
   a second power line disposed between the first group and the second group, wherein the symmetric first power line, the symmetric first word line, the symmetric second word line, the first bit line bar and the second bit line bar are mirror symmetric to the first power line, the first word line, the second word line, the first bit line and the second bit line by the second power line.

2. The dual port static random access memory cell according to claim 1, wherein the second power line is directly next to the second word line and the symmetric second word line.

3. The dual port static random access memory cell according to claim 1, wherein the first power line, the symmetric first power line, the second power line, the first word line, the symmetric first word line, the second word line, the symmetric second word line, the first bit line, the first bit line bar, the second bit line and the second bit line bar are in one same metal layer.

4. The dual port static random access memory cell according to claim 1, wherein a first port comprises the first word line, the symmetric first word line, the first bit line and the first bit line bar, and a second port comprises the second word line, the symmetric second word line, the second bit line and the second bit line bar.

5. The dual port static random access memory cell according to claim 1, wherein the first word line and the symmetric first word line are electrically connected to each other and serve as one common first word line, and the second word line and the symmetric second word line are electrically connected to each other and serve as one common second word line.

6. The dual port static random access memory cell according to claim 5, wherein the dual port static random access memory cell comprises a first pull-up device, a second pull-up device, a first pull-down -1 device, a first pull-down -2 device, a second pull-down -1 device, a second pull-down -2 device, a first pass gate device, a second pass gate device, a third pass gate device and a fourth pass gate device.

7. The dual port static random access memory cell according to claim 6, wherein the common first word line is electrically connected to gate nodes of the first pass gate device and the third pass gate device, and the common second word line is electrically connected to gate nodes of the second pass gate device and the fourth pass gate device.

8. The dual port static random access memory cell according to claim 6, wherein the first bit line is electrically connected to a drain node of the first pass gate device.

9. The dual port static random access memory cell according to claim 6, wherein the second bit line is electrically connected to a drain node of the second pass gate device.

10. The dual port static random access memory cell according to claim 6, wherein the first bit line bar is electrically connected to a drain node of the third pass gate device.

11. The dual port static random access memory cell according to claim 6, wherein the second bit line bar is electrically connected to a drain node of the fourth pass gate device.

12. The dual port static random access memory cell according to claim 6, wherein the first power line is electrically connected to source nodes of the first pull-down -1 device and the first pull-down -2 device, and the symmetric first power line is electrically connected to source nodes of the second pull-down -1 device and the second pull-down -2 device.

13. The dual port static random access memory cell according to claim 6, wherein the dual port static random access memory cell comprises a first active region, a second active region, a third active region, a fourth active region, a fifth active region and a sixth active region, wherein the first active region comprises the first pass gate device and the first pull-down -2 device, the second active region comprises the second pass gate device and the first pull-down -1 device, the third active region comprises the fourth pass gate device and the second pull-down -1 device, the fourth active region comprises the third pass gate device and the second pull-down -2 device, the fifth active region comprises the first pull-up device, and the sixth active region comprises the second pull-up device.

14. The dual port static random access memory cell according to claim 13, wherein the first active region, the second active region, the third active region and the fourth active region are all rectangular-shaped.

15. The dual port static random access memory cell according to claim 13, wherein the first active region, the second active region, the third active region and the fourth active region have a same surface area.

16. The dual port static random access memory cell according to claim 6, further comprising:
a second word line contact physically connected to the second word line being disposed between the first pull-up device and the first pull-down -1 device, and a symmetric second word line contact physically connected to the symmetric second word line being disposed between the second pull-up device and the second pull-down -1 device.

17. A dual port static random access memory cell, comprising:
a first bit line and a second bit line disposed between a first word line and a second word line, wherein the first bit line is next to the first word line, and the second bit line is next to the second word line;
two first power lines disposed between the first word line and the first bit line, and between the second word line and the second bit line respectively, wherein the first bit line, the second bit line, the first word line, the second word line and the two first power lines constitute a first group;
a first bit line bar and a second bit line bar disposed between a symmetric first word line and a symmetric second word line, wherein the first bit line bar is next to the symmetric first word line, and the second bit line bar is next to the symmetric second word line;
two symmetric first power lines disposed between the first bit line bar and the symmetric first word line, and between the second bit line bar and the symmetric second word line, wherein the first bit line bar, the second bit line bar, the symmetric first word line, the symmetric second word line and the two symmetric first power lines constitute a second group; and
a second power line disposed between the first group and the second group, wherein the first bit line bar, the second bit line bar, the symmetric first word line, the symmetric second word line and the two symmetric first power lines are mirror symmetric to the first bit line, the second bit line, the first word line, the second word line and the first power lines by the second power line.

18. The dual port static random access memory cell according to claim 17, wherein the second power line is directly next to the second word line and the symmetric second word line.

19. The dual port static random access memory cell according to claim 17, wherein the first power lines, the symmetric first power lines, the second power line, the first word line, the symmetric first word line, the second word line, the symmetric second word line, the first bit line, the first bit line bar, the second bit line and the second bit line bar are in one same metal layer.

20. The dual port static random access memory cell according to claim 17, wherein a first port comprises the first word line, the symmetric first word line, the first bit line and the first bit line bar, and a second port comprises the second word line, the symmetric second word line, the second bit line and the second bit line bar.

21. The dual port static random access memory cell according to claim 17, wherein the first word line and the symmetric first word line are electrically connected to each other and serve as one common first word line, and the second word line and the symmetric second word line are electrically connected to each other and serve as one common second word line.

22. The dual port static random access memory cell according to claim 21, wherein the dual port static random access memory cell comprises a first pull-up device, a second pull-up device, a first pull-down device, a second pull-down device, a first pass gate device, a second pass gate device, a third pass gate device and a fourth pass gate device.

23. The dual port static random access memory cell according to claim 22, wherein the common first word line is electrically connected to gate nodes of the first pass gate device and the third pass gate device, and the common second word line is electrically connected to gate nodes of the second pass gate device and the fourth pass gate device.

24. The dual port static random access memory cell according to claim 22, wherein the first bit line is electrically connected to a drain node of the first pass gate device.

25. The dual port static random access memory cell according to claim 22, wherein the second bit line is electrically connected to a drain node of the second pass gate device.

26. The dual port static random access memory cell according to claim 22, wherein the first bit line bar is electrically connected to a drain node of the third pass gate device.

27. The dual port static random access memory cell according to claim 22, wherein the second bit line bar is electrically connected to a drain node of the fourth pass gate device.

28. The dual port static random access memory cell according to claim 22, wherein the first power lines and the symmetric first power lines are electrically connected to source nodes of the first pull-down device and the second pull-down device.

* * * * *